(12) United States Patent
Hsu

(10) Patent No.: US 7,817,441 B2
(45) Date of Patent: Oct. 19, 2010

(54) CIRCUIT BOARD

(75) Inventor: Shih-Ping Hsu, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 61 days.

(21) Appl. No.: 12/122,014

(22) Filed: May 16, 2008

(65) Prior Publication Data

US 2009/0032294 A1 Feb. 5, 2009

(30) Foreign Application Priority Data

Aug. 3, 2007 (TW) .............................. 96128510 A

(51) Int. Cl.
*H05K 7/10* (2006.01)
*H05K 1/03* (2006.01)
*H05K 1/09* (2006.01)
*H05K 7/12* (2006.01)

(52) U.S. Cl. .................. 361/767; 174/255; 174/256; 174/257; 174/258; 361/770; 361/771; 361/772; 361/774

(58) Field of Classification Search .......... 174/266; 361/767–771, 774
See application file for complete search history.

(56) References Cited

U.S. PATENT DOCUMENTS

| 4,706,167 | A | * | 11/1987 | Sullivan | 361/774 |
|---|---|---|---|---|---|
| 4,813,129 | A | * | 3/1989 | Karnezos | 29/832 |
| 6,018,197 | A | * | 1/2000 | Saiki et al. | 257/784 |
| 6,165,885 | A | * | 12/2000 | Gaynes et al. | 438/612 |
| 6,443,351 | B1 | * | 9/2002 | Huang et al. | 228/103 |
| 6,472,608 | B2 | * | 10/2002 | Nakayama | 174/255 |
| 6,512,182 | B2 | * | 1/2003 | Takeuchi et al. | 174/256 |
| 6,570,251 | B1 | * | 5/2003 | Akram et al. | 257/738 |
| 6,809,415 | B2 | * | 10/2004 | Tsukada et al. | 257/693 |
| 6,998,293 | B2 | * | 2/2006 | Achari et al. | 438/108 |
| 2004/0084206 | A1 | * | 5/2004 | Tung | 174/255 |
| 2006/0087039 | A1 | * | 4/2006 | Cheng et al. | 257/750 |

* cited by examiner

*Primary Examiner*—Hung S Bui
*Assistant Examiner*—Steven Sawyer
(74) *Attorney, Agent, or Firm*—Schmeiser, Olsen & Watts LLP

(57) ABSTRACT

Provided is a circuit board including: a circuit board body with at least one surface having a plurality of electrically connecting pads; an insulating protection layer formed on the circuit board body and formed with an opening corresponding in position to one of the electrically connecting pads, being larger than the electrically connecting pad, and not being in contact with the periphery of the electrically connecting pad; and a soldering material formed on, and confined to, the electrically connecting pad; thus allowing an electrically conductive element limited in the opening formed in the insulating protection layer to be fabricated from the soldering material by a reflow process with a view to forming a fine-pitch electrically connecting structure.

8 Claims, 9 Drawing Sheets

CIRCUIT BOARD

BACKGROUND OF THE INVENTION

1. Field of the Invention

The present invention relates to circuit boards, and more particularly, to an electrically connecting structure of a circuit board.

2. Description of the Prior Art

The widely used flip-chip technology allows a semiconductor chip to electrically connect with a circuit board. The semiconductor chip has an active surface with a plurality of electrode pads, and the circuit board is provided with electrically connecting pads corresponding in position to the electrode pads. Soldering structures are formed between the electrode pads and the electrically connecting pads to provide electrical and mechanical connections between the semiconductor chip and the circuit board.

Referring to FIGS. 1A to 1E, cross-sectional views depicting a conventional method for fabricating electrically connecting structures of a circuit board are shown. As shown in FIG. 1A, a circuit board body 10 is provided. A plurality of electrically connecting pads 11 are formed on at least one surface of the circuit board body 10. An insulating protection layer 12 is then formed on the circuit board body 10, which has openings 120 to expose the electrically connecting pads 11. As shown in FIG. 1B, a screen is disposed on the insulating protection layer 12 having openings 130 corresponding in position to the electrically connecting pads 11 for exposing the electrically connecting pads 11. Due to the alignment precision, the diameter of the openings 130 of the screen 13 are larger than those of the openings of the insulating protection layer 12. As shown in FIG. 1C, the openings 130 are coated with a soldering material 14. As shown in FIG. 1D, the screen 13 is removed to expose the soldering material 14. Since the openings of the screen 13 are larger than those of the insulating protection layer 12, wings 140 of the soldering material 14 are formed on the insulating protection layer 12. As shown in FIG. 1E, electrically conductive elements 14' with wings 140' are formed from the soldering material 14.

As regards a structure formed by the method above, the electrically conductive elements 14' have wings 140', so the electrically conductive elements 14' cover a certain area. A definite pitch must be maintained between the electrically conductive elements 14' to avoid short circuits therebetween when the circuit board body 10 and the semiconductor chip are electrically connected to each other. No high-density, fine-pitch electrically conductive structures can be implemented, not only because the wings 140 of the electrically conductive elements 14' cover a certain area, but because of the irreducible pitch between the electrically conductive elements 14'.

Therefore, there is an urgent need to develop electrically conductive elements 14' of a circuit board without wings 140' with a view to increasing circuit layout density and achieving finer pitches.

SUMMARY OF THE INVENTION

In light of forgoing drawbacks, an objective of the present invention is to provide a circuit board that avoids the formation of electrically conductive elements with wings in order to provide a fine pitch structure.

Another objective of the present invention is to provide a circuit board, wherein electrically connecting pads are enclosed by electrically conductive elements to increase bonding therebetween, thus enhancing the reliability.

In accordance with the above and other objectives, the present invention provides a circuit board comprising: a circuit board body having at least one electrically connecting pads formed on at least one surface thereof; an insulating protection layer formed on the circuit board body and formed with an opening corresponding in position to the electrically connecting pad, the opening being larger than the electrically connecting pad and not being in contact with the periphery of the electrically connecting pad, such that the electrically connecting pad is a non-solder-mask defined pad (NSMD); and a soldering material formed on the electrically connecting pad and being smaller than the electrically connecting pad in diameter. The soldering material is one selected from the group consisting of tin (Sn), silver (Ag), lead (Pb), bismuth (Bi), zinc (Zn), and indium (In).

Based on the above structure, the soldering material is turned into an electrically conductive element by a reflow process, such that the electrically conductive element encloses the electrically connecting pad and is limited in an opening of the insulating protection layer. A flat plane is further formed on the top surface of the electrically conductive element by coining. Additionally, at least one trace is formed on the circuit board body.

In another embodiment of the structure of the present invention, the circuit board further comprises at least one metal bump with the same diameter as the soldering material and between the solder material and the electrically connecting pad. The metal bump is copper (Cu), nickel/gold (Ni/Au, where a nickel layer is formed before a gold layer), chromium (Cr), or nickel/palladium/gold (Ni/Pd/Au).

In another embodiment of the present invention, the circuit board further comprises at least one metal layer on the electrically connecting pad, wherein the metal layer is made from nickel (Ni), gold (Au), nickel/gold (Ni/Au, where a nickel layer is formed before a gold layer), zinc (Zn), or nickel/palladium/gold (Ni/Pd/Au).

According to the circuit board of the present invention, since the electrically connecting pad is a non-solder-mask defined pad (NSMD), the opening of the insulating protection layer is larger than the electrically connecting pad and is not in contact with the periphery of the electrically connecting pad; the soldering material is smaller than the electrically connecting pad; when the soldering material is reflowed to form the electrically conductive element, the electrically conductive element is within the opening of the insulating protection layer, thus avoiding the formation of known wings and reducing the pitch between the electrically conductive elements to meet the fine pitch requirement. Moreover, the electrically conductive element fully encloses the electrically connecting pad, which increases the contact area, and thus the bonding, between the electrically conductive element and the electrically connecting pad, thereby enhancing the reliability in coupling the circuit board body to a semiconductor chip.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

The present invention is described by the following specific embodiments. Those with ordinary skills in the arts can readily understand the other advantages and functions of the present invention after reading the disclosure of this specification. The present invention can also be implemented with different embodiments. Various details described in this specification can be modified based on different viewpoints and applications without departing from the scope of the present invention.

First Embodiment

Referring to FIGS. 2A to 2I, cross-sectional views are shown for illustrating a method for fabricating a circuit board according to a first embodiment of the present invention.

Figure 1A:
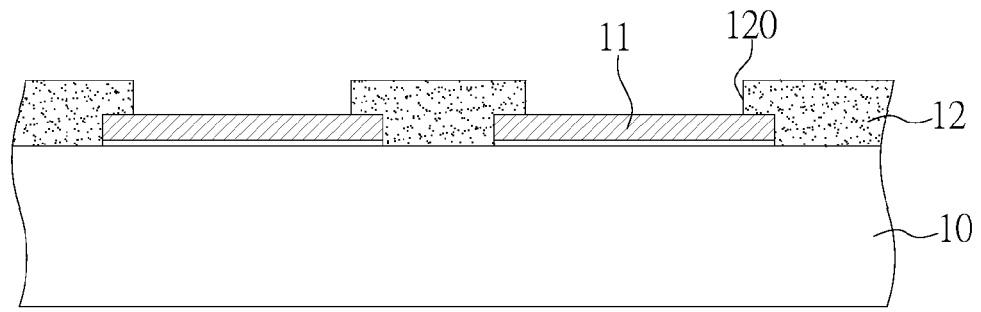
FIGS. 1A to 1E are cross-sectional views depicting a conventional method for fabricating electrically connecting structures of a circuit board.
Figure 1B:
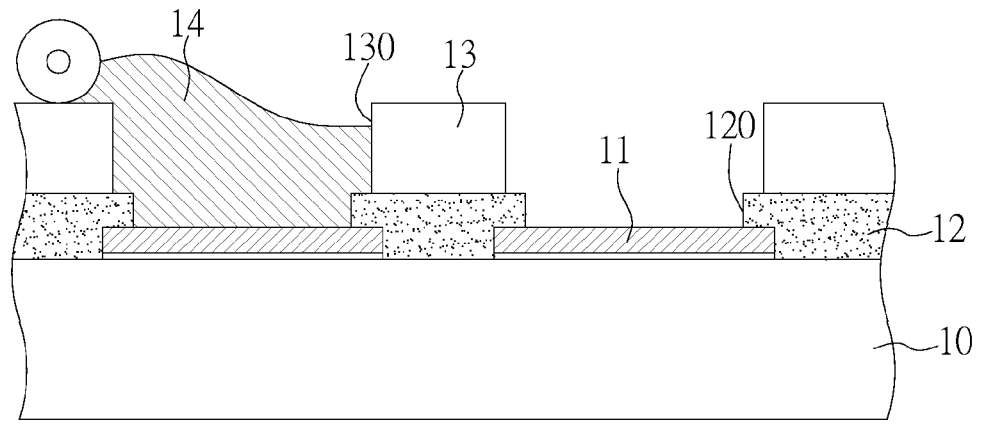
Figure 1C:
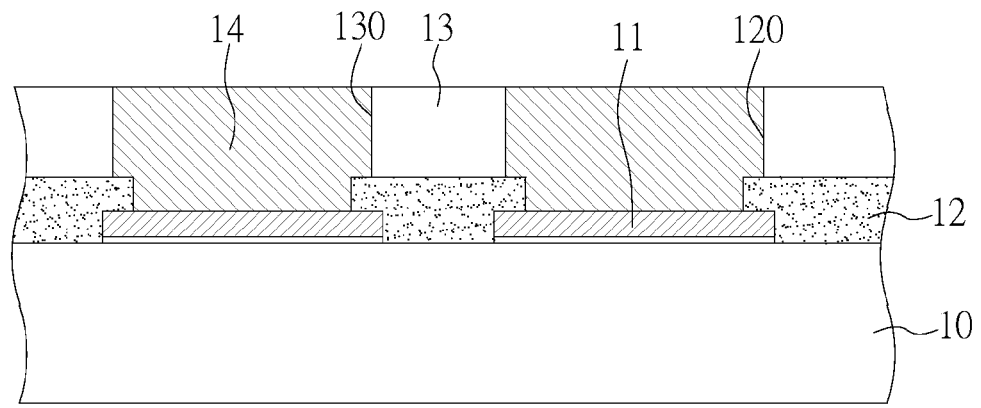
Figure 1D:
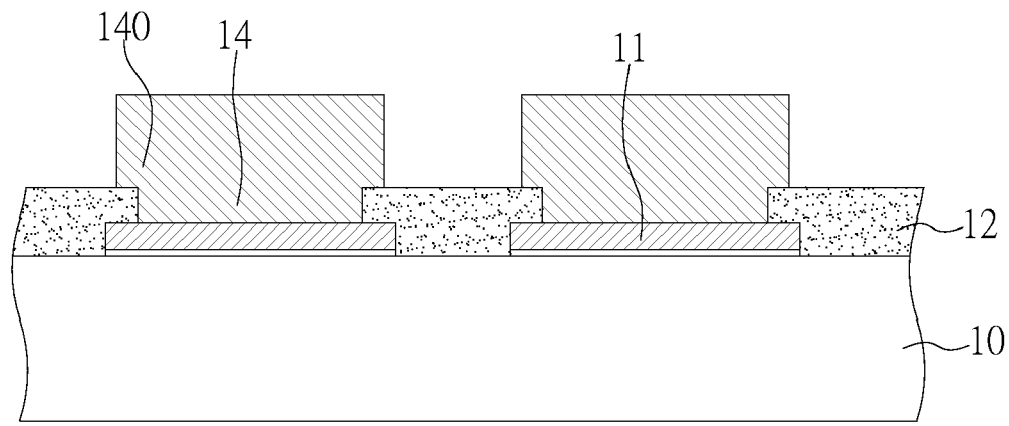
Figure 1E:
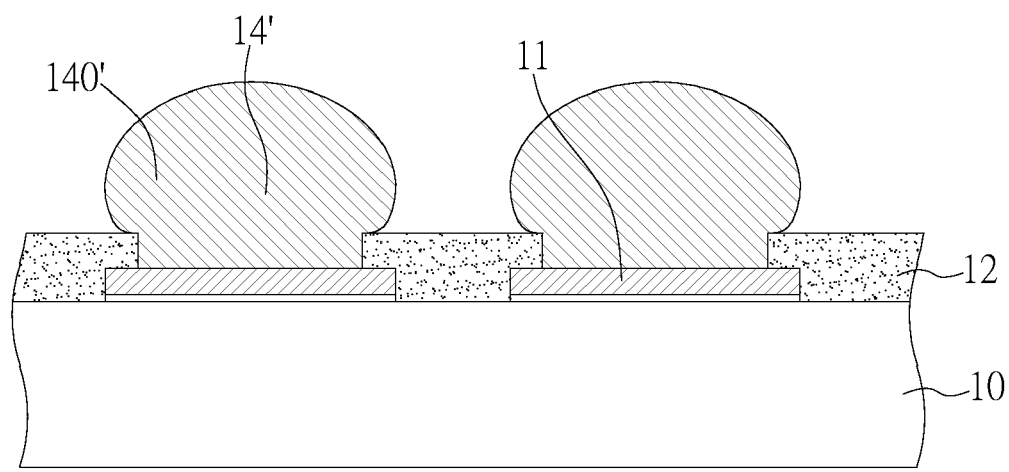
Figure 2A:
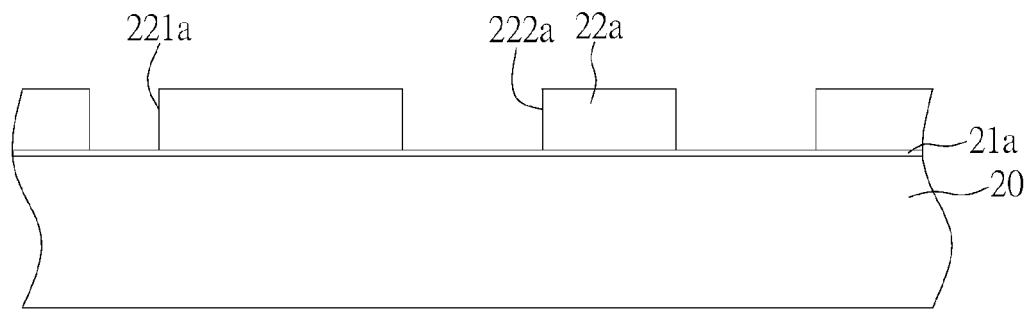
FIGS. 2A to 2I are cross-sectional views illustrating a method for fabricating a circuit board having electrically connecting structures according to a first embodiment of the present invention.

As shown in FIG. 2A, a circuit board body 20 is provided, and a first electrically conductive layer 21a is formed on at least one surface of the circuit board body 20. A first resist layer 22a is then formed on the first electrically conductive layer 21a. The first resist layer 22a is formed with at least one first opening 221a and at least one second opening 222a to expose the first electrically conductive layer 21a.

Figure 2B:
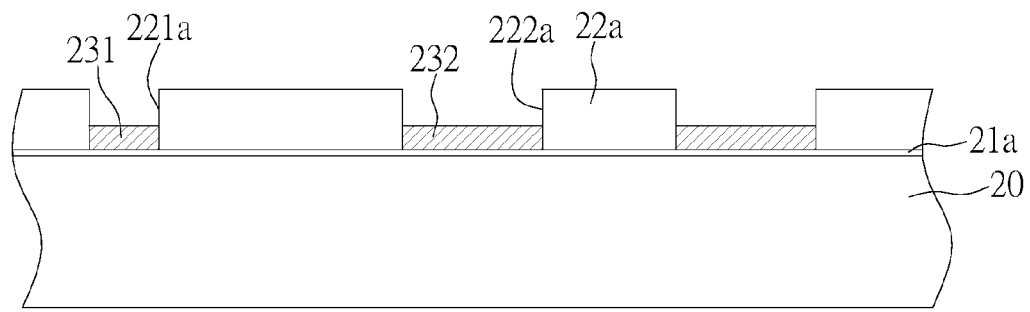

As shown in FIG. 2B, a trace 231 is formed on the first electrically conductive layer 21a in the first opening 221a by electroplating, and an electrically connecting pad 232 is formed in the second opening 222a also by electroplating. The trace 231 and the electrically connecting pad 232 are made of cupper (Cu) or metals with relatively good electrical conductivity.

Figure 2C:
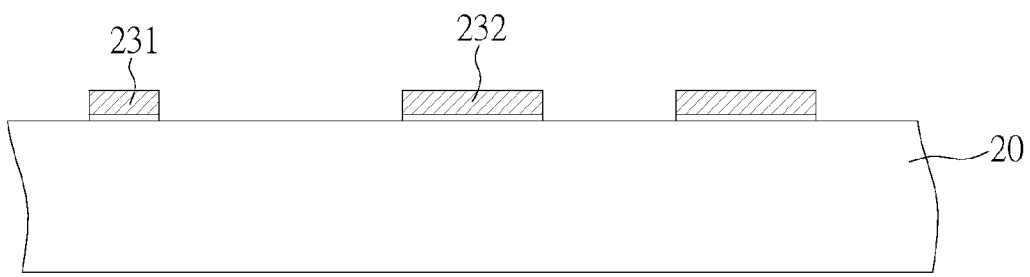

As shown in FIG. 2C, the first resist layer 22a and the portion of the first electrically conductive layer 21a covered by the first resist layer 22a are removed, such that the trace 231 and the electrically connecting pad 232 protrude from the circuit board body 20.

Figure 2D:
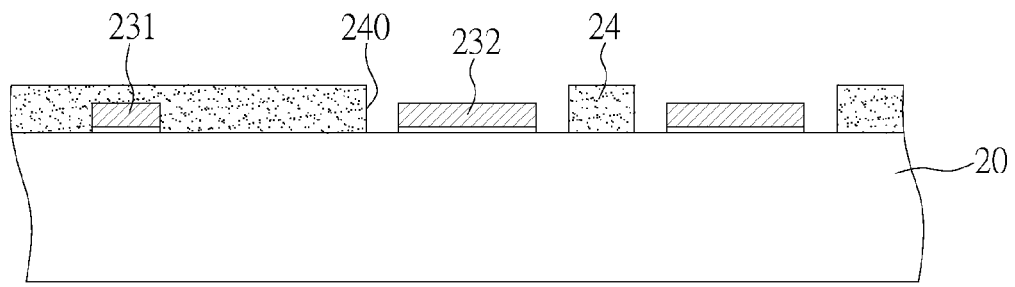

As shown in FIG. 2D, an insulating protection layer 24 is formed on the circuit board body 20 with an opening 240 to expose the electrically connecting pad 232. The aperture of the opening 240 is larger than the diameter of the electrically connecting pad 232 and not in contact with the periphery of the electrically connecting pad 232, thereby forming a non-solder-mask-defined pad.

Figure 2E:
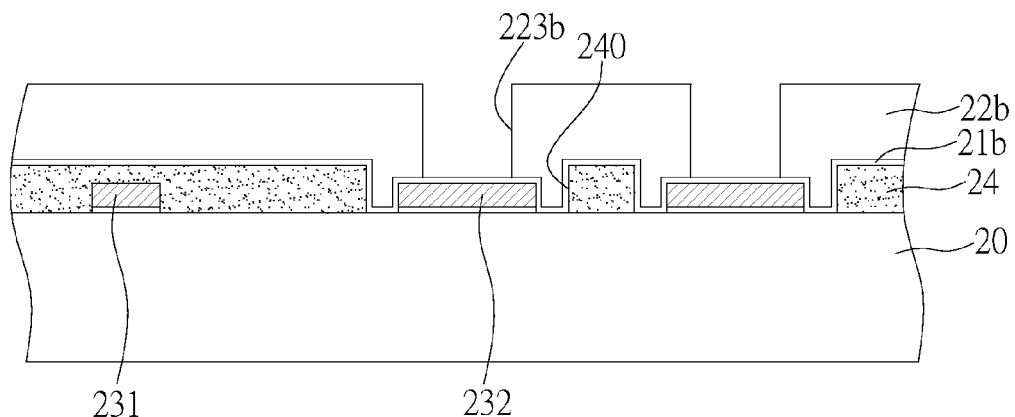

As shown in FIG. 2E, a second electrically conductive layer 21b is formed on the insulating protection layer 24 and the electrically connecting pad 232 and in the opening 240. A second resist layer 22b is formed on the second electrically conductive layer 21b with a third opening 223b to expose the electrically connecting pad 232. The diameter of the third opening 223b is smaller than that of the electrically connecting pad 232.

Figure 2F:
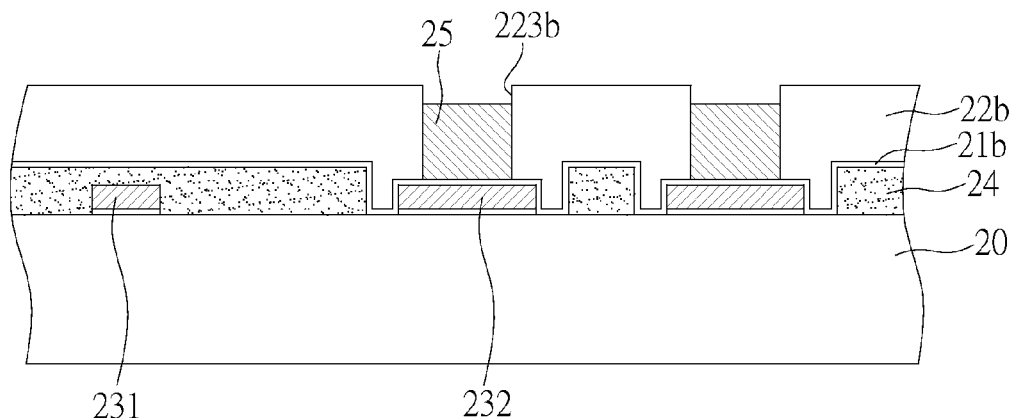

As shown in FIG. 2F, a solder material 25 is formed on the second electrically conductive layer 21b in the third opening 223b by electroplating. The solder material 25 is formed from one selected from the group consisting of tin (Sn), silver (Ag), lead (Pb), bismuth (Bi), zinc (Zn) and indium (In).

Figure 2G:
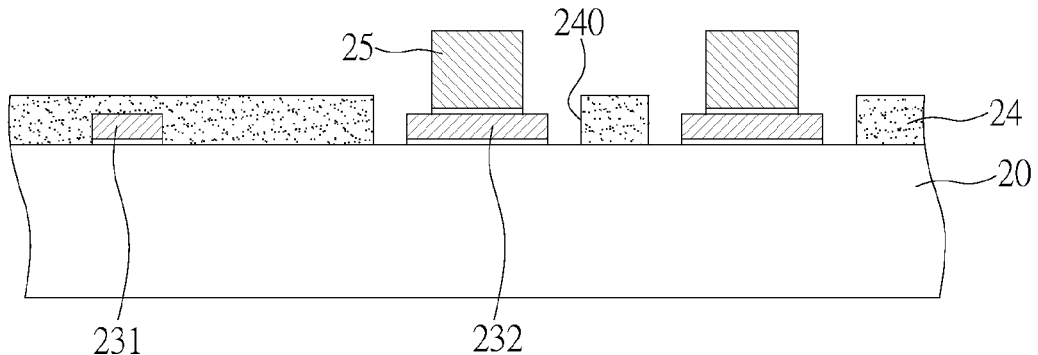

As shown in FIG. 2G, the second resist layer 22b and the portion of the second electrically conductive layer 21b covered by the second resist layer 22b are removed, such that the soldering material 25, the electrically connecting pad 232 and the insulating protection layer 24 are exposed.

Figure 2H:
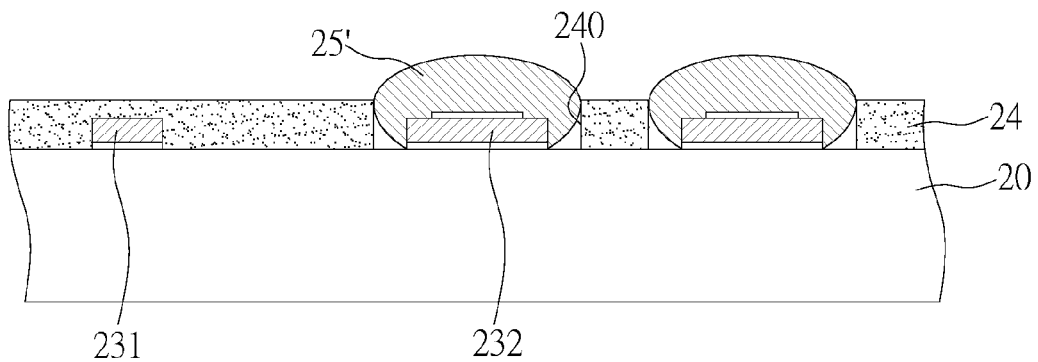

As shown in FIG. 2H, the soldering material 25 forms an electrically conductive element 25' by a reflow process, and the electrically conductive element 25' covers the electrically connecting pad 232. The electrically conductive element 25' is within the opening 240 of the insulating protection layer 24, thus forming no wing on the insulating protection layer 24 and reducing the pitch between the electrically conductive elements 25' to meet the fine pitch requirement.

Figure 2I:
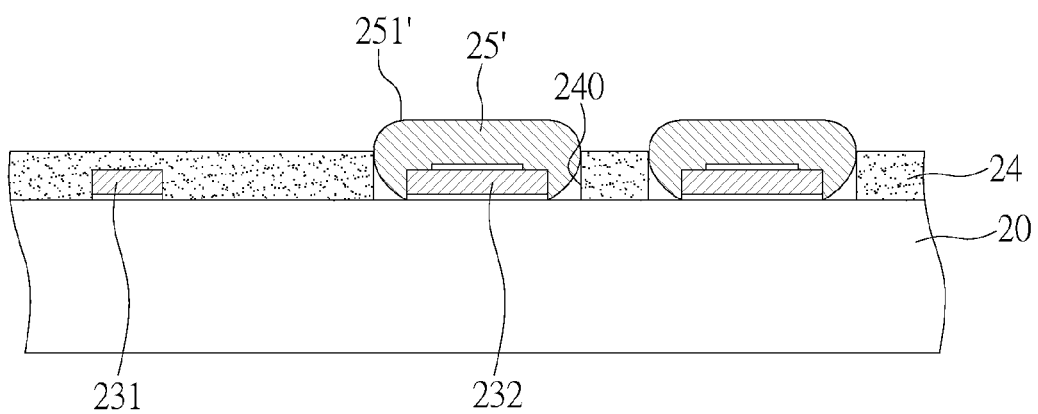

As shown in FIG. 2I, the electrically conductive element 25' is finally coined to form a flat plane 251', thereby achieving electrically conductive elements 25' with a uniform height, avoiding uneven stress due to uneven heights during electrically connection.

The present invention provides a circuit board comprising: a circuit board body 20 with at least one surface having at least one trace 231 and a plurality of electrically connecting pads 232; an insulating protection layer 24 formed on the circuit board body 20 and formed with at least one opening 240 corresponding in position to one of the electrically connecting pads 232, the opening 240 being larger than the electrically connecting pad 232 and not being in contact with the periphery of the electrically connecting pad 232; and a soldering material 25 formed on the electrically connecting pad 232, wherein the soldering material 25 is turned into an electrically conductive element 25' by a reflow process, such that the electrically conductive element 25' encloses the electrically connecting pad 232, is limited in the opening 240 of the insulating protection layer 24, and has a top surface provided with a flat plane 251'.

Given the above structure, the soldering material 25 is one selected from the group consisting of tin (Sn), silver (Ag), copper (Cu), lead (Pb), bismuth (Bi), zinc (Zn), indium (In).

According to the circuit board of the present invention, the diameter of the soldering material 25 is smaller than that of the electrically connecting pad 232, and the soldering material 25 forms an electrically conductive element 25' by a reflow process. The electrically conductive element 25' is in the opening 240, thus forming no wing on the insulating protection layer 24 and reducing the pitch between the electrically conductive elements 25' to meet the fine pitch requirement. Moreover, the electrically conductive element 25' fully encloses the electrically connecting pad 232 before being coined, so as to increase the contact area, and thus the bonding, between the electrically conductive element 25' and the electrically connecting pad 232, thereby enhancing the reliability in coupling the circuit board body to the semiconductor chip.

Second Embodiment

Referring to FIGS. 3A to 3F, cross-sectional views are shown for illustrating a method for fabricating a circuit board according to a second embodiment of the present invention. This embodiment is different from the above embodiment in that there is a metal bump between the electrically connecting pad and the soldering material.

Figure 3A:
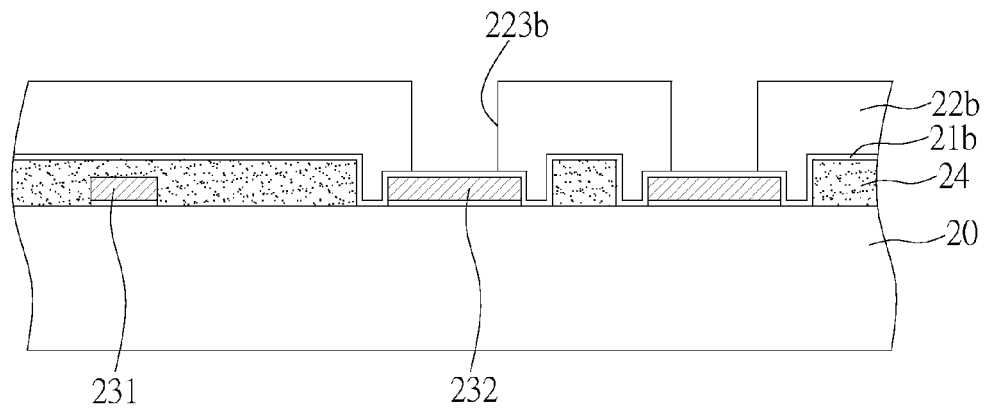
FIGS. 3A to 3F are cross-sectional views illustrating a method for fabricating a circuit board having electrically connecting structures according to a second embodiment of the present invention.

As shown in FIG. 3A, a structure similar to that shown in FIG. 2E is provided. A third opening 223b is then formed in the second resist layer 22b to expose the second electrically conductive layer 21b on the electrically connecting pad 232.

Figure 3B:
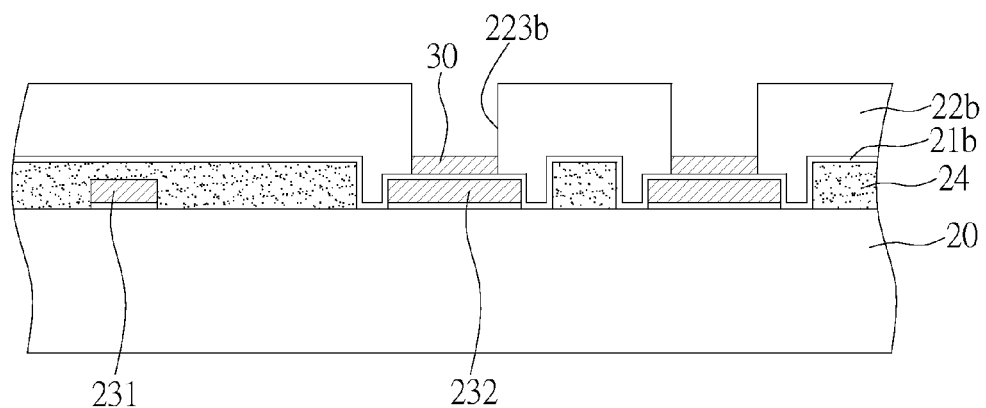

As shown in FIG. 3B, a metal bump 30 is formed on the second electrically conductive layer 21b in the third opening 223b by electroplating. The metal bump 30 is copper (Cu), nickel/gold (Ni/Au, where a nickel layer is formed before a gold layer), chromium (Cr), or nickel/palladium/gold (Ni/Pd/Au).

Figure 3C:
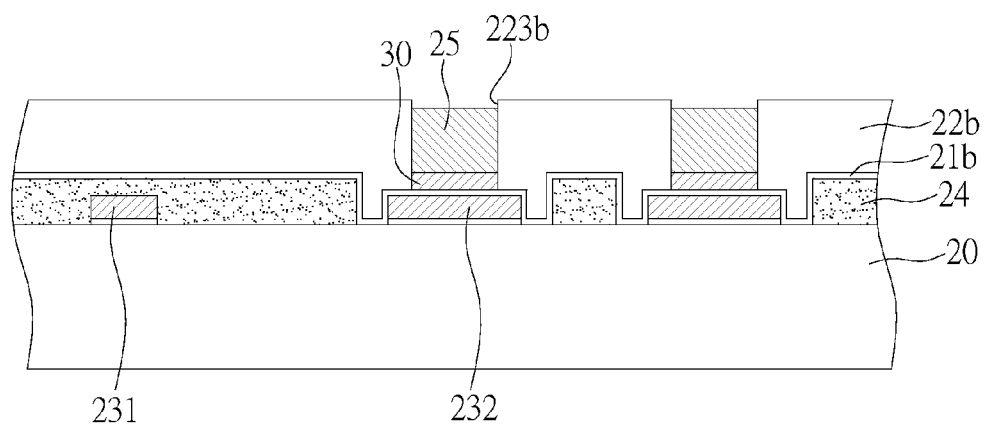

As shown in FIG. 3C, a solder material 25 is formed on the metal bump 30. The diameters of the soldering material 25 and the metal bump 30 are substantially equal.

Figure 3D:
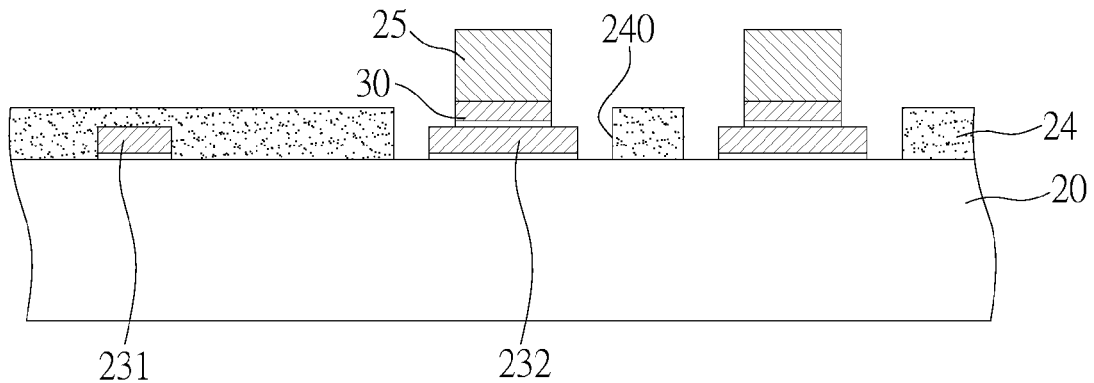

As shown in FIG. 3D, the second resist layer 22b and the portion of the second electrically conductive layer 21b covered by the second resist layer 22b are removed, such that the soldering material 25, the metal bump 30, the electrically connecting pad 232 and the insulating protection layer 24 are exposed.

Figure 3E:
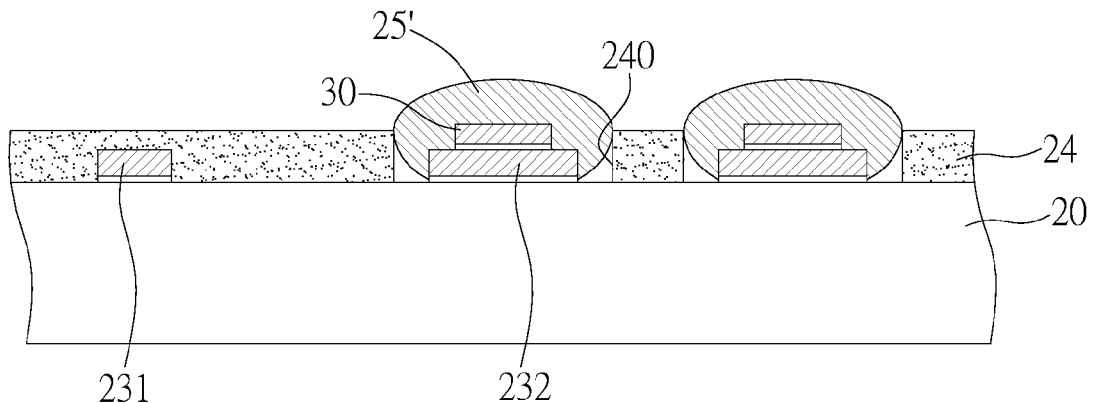

As shown in FIG. 3E, the soldering material 25 is turned into an electrically conductive element 25' by a reflow process to enclose the metal bump 30 and the electrically connecting pad 232. The electrically conductive element 25' is limited in the opening 240 of the insulating protection layer 24.

Figure 3F:
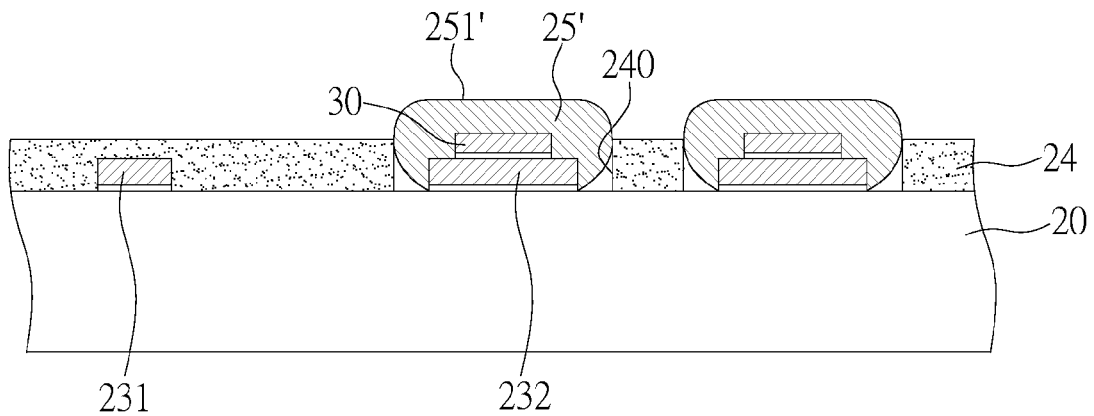

As shown in FIG. 3F, the electrically conductive element 25' is coined to form a flat plane 251'.

The present invention provides a circuit board comprising: a circuit board body 20 with at least one surface having at least one trace 231 and a plurality of electrically connecting pads 232; an insulating protection layer 24 formed on the circuit board body 20 and formed with at least one opening 240 corresponding in position to one of the electrically connecting pads 232, the opening 240 being larger than the electrically connecting pad 232 and not being in contact with the periphery of the electrically connecting pad 232; a metal bump 30 disposed on the electrically connecting pad 232 and being smaller than the electrically connecting pad 232 in diameter; and a soldering material 25 formed on the metal bump 30 and equaling the metal bump 30 in diameter.

Given the above structure, the soldering material 25 is turned into an electrically conductive element 25' by a reflow process, such that the electrically conductive element 25' encloses the metal bump 30 and the electrically connecting pad 232. The top surface of the electrically conductive element 25' is a flat plane 251'.

Third Embodiment

FIGS. 4A to 4F show cross-sectional views that illustrate a method for fabricating a circuit board according to a third embodiment of the present invention. The third embodiment is different from the above embodiment in that there is a metal layer between the electrically connecting pad and the soldering material.

Figure 4A:
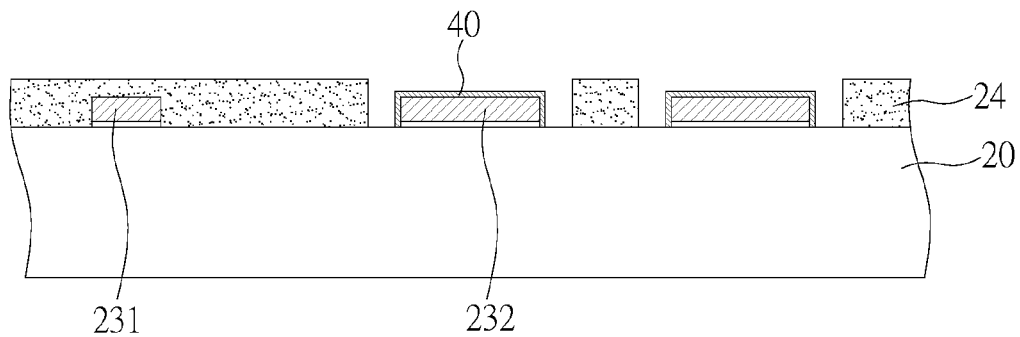
FIGS. 4A to 4F are cross-sectional views illustrating a method for fabricating a circuit board having electrically connecting structures according to a third embodiment of the present invention.

As shown in FIG. 4A, a structure similar to that shown in FIG. 2D is provided. The insulating protection layer 24 is formed with an opening 240 to expose the electrically connecting pad 232. The opening 240 is larger than the electrically connecting pad 232 in diameter and is not in contact with the periphery of the electrically connecting pad 232. A metal layer 40 is chemically deposited on the electrically connecting pad 232. The metal layer 40 is made of nickel (Ni), gold (Au), nickel/gold (Ni/Au, where a nickel layer is formed before a gold layer), zinc (Zn), or nickel/palladium/gold (Ni/Pd/Au).

Figure 4B:
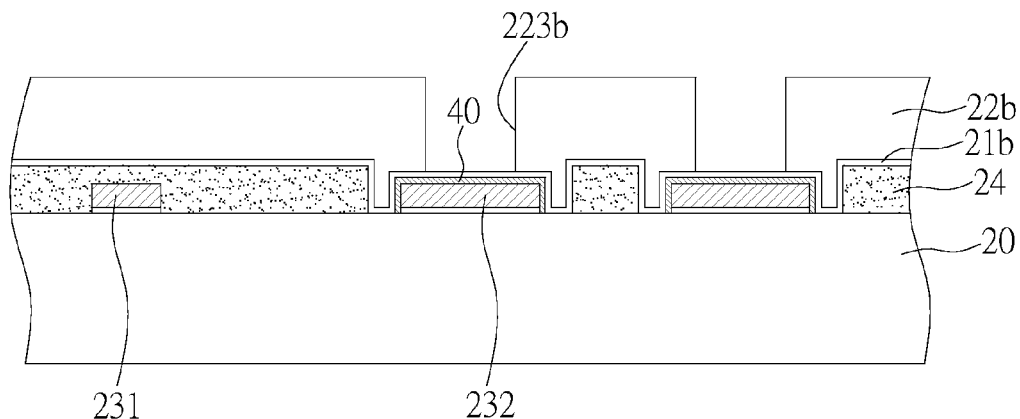

As shown in FIG. 4B, a second electrically conductive layer 21b is formed on the insulating protection layer 24 and the metal layer 40 and in the opening 240. A second resist layer 22b is formed on the second electrically conductive layer 21b. A third opening 223b is formed in the second resist layer 22b. The diameter of the third opening 223b is smaller than the diameter of the electrically connecting pad 232. The third opening 223b exposes a portion of the second electrically conductive layer 21b.

Figure 4C:
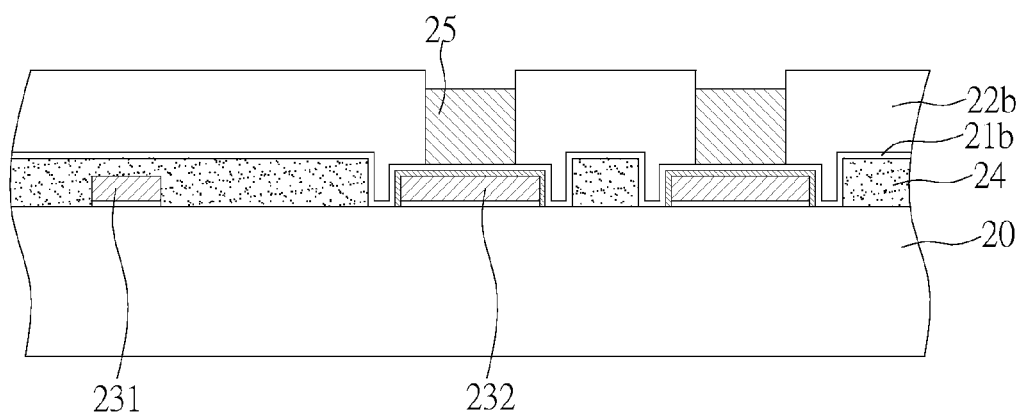

As shown in FIG. 4C, a solder material 25 is formed on the second electrically conductive layer 21b in the third opening 223b by electroplating.

Figure 4D:
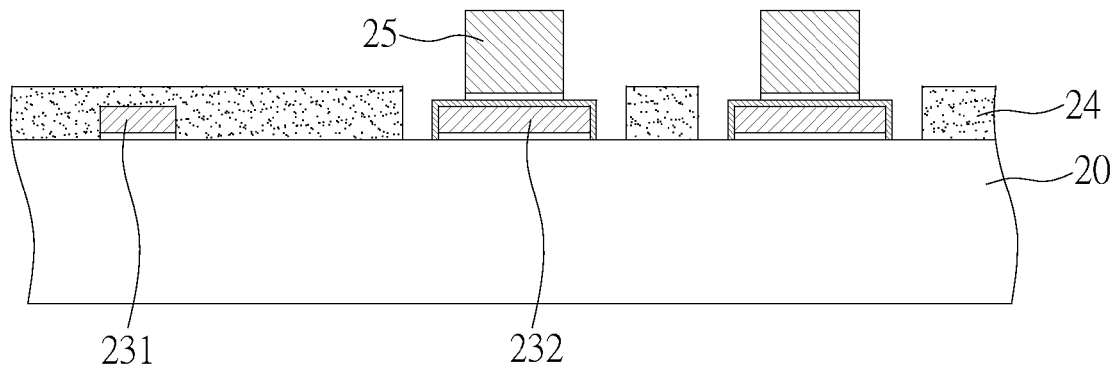

As shown in FIG. 4D, the second resist layer 22b and the portion of the second electrically conductive layer 21b covered by the second resist layer 22b are removed, such that the soldering material 25, the metal layer 40 and the insulating protection layer 24 are exposed.

Figure 4E:
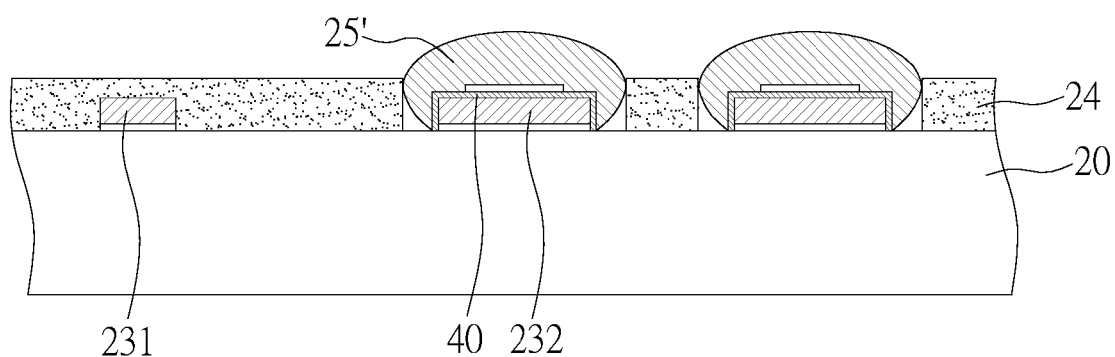

As shown in FIG. 4E, the soldering material 25 forms an electrically conductive element 25' by a reflow process, so as to enclose the metal layer 40.

Figure 4F:
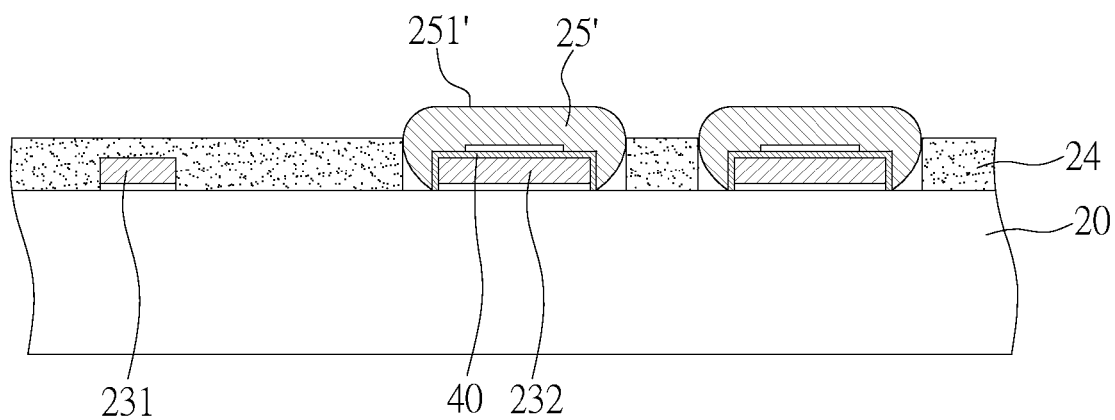

As shown in FIG. 4F, the top surface of the electrically conductive element 25' is coined to form a flat plane 251'.

The present invention provides a circuit board comprising: a circuit board body 20 with at least one surface having at least one trace 231 and a plurality of electrically connecting pads 232; an insulating protection layer 24 formed on the circuit board body 20 and formed with at least one opening 240 corresponding in position to one of the electrically connecting pads 232, the opening 240 being larger than the electrically connecting pad 232 and not being in contact with the periphery of the electrically connecting pad 232; a metal layer 40 disposed on the electrically connecting pad; and a soldering material 25 formed on the metal layer 40.

The metal layer 40 increases bonding between the electrically connecting pad 232 and the electrically conductive element 25'.

According to the above circuit boards of the present invention, the electrically connecting pad is a non-solder-mask defined pad (NSMD); the opening of the insulating protection layer is larger than the electrically connecting pad and is not in contact with the periphery of the electrically connecting pad; the soldering material is smaller than the electrically connecting pad. After the soldering material is reflowed to form the electrically conductive element, the electrically conductive element is within the opening of the insulating protection layer, thus forming no wing, reducing the pitch between the electrically conductive elements, and eventually meeting the fine pitch requirement. Moreover, the electrically conductive element fully encloses the electrically connecting pad, which increases the contact area, and thus the bonding, between the electrically conductive element and the electrically connecting pad, thereby enhancing the reliability in coupling the circuit board body to a semiconductor chip. Furthermore, the top surface of the electrically conductive element is coined to form a flat plane, thereby achieving electrically conductive elements with a uniform height, avoiding uneven stress due to uneven heights during electrical connection.

The above embodiments are only used to illustrate the principles of the present invention, and they should not be construed as to limit the present invention in any way. The above embodiments can be modified by those with ordinary skills in the arts without departing from the scope of the present invention as defined in the following appended claims.

What is claimed is:
1. A circuit board, comprising:
   a circuit board body having a plurality of electrically connecting pads disposed on one surface of the circuit board body;
   an insulating protection layer formed on the circuit board body and having a plurality of openings corresponding in position to and exposing the electrically connecting pads, the openings being larger than the electrically connecting pad, allowing the insulating protection layer to be free from contact with a sidewall of the electrically connecting pad;

an electrically conductive layer formed on a central portion of each of the electrically connecting pads, wherein a width of the electrically conductive layer is smaller than that of the electrically connecting pads, such that a ring of a top surface of each of the electrically connecting pads is not covered by the electrically conductive layer; and at least one copper bump formed on each of the electrically conductive layer, wherein a length of the copper bump is larger than a thickness of the electrically conductive layer; and a soldering material altogether wrapping the copper bump, the electrically conductive layer, the non-covered surface and sidewall of the electrically connecting pad in each of the openings.

2. The circuit board of claim 1, wherein the soldering material is reflowed to form an electrically conductive element enclosing the electrically connecting pad and being limited in the opening of the insulating protection layer.

3. The circuit board of claim 2, wherein a top surface of the electrically conductive element is a flat plane.

4. The circuit board of claim 1, wherein the soldering material is one selected from the group consisting of tin (Sn), silver (Ag), copper (Cu), lead (Pb), bismuth (Bi), zinc (Zn), and indium (In).

5. The circuit board of claim 1, further comprising at least one trace on the circuit board body.

6. The circuit board of claim 1, wherein the copper bump has the same diameter as the soldering material and is beneath the soldering material.

7. The circuit board of claim 1, further comprising at least one metal layer enclosing the electrically connecting pad.

8. The circuit board of claim 7, wherein the metal layer is one selected from the group consisting of nickel (Ni), gold (Au), nickel/gold (Ni/Au), zinc (Zn), and nickel/palladium/gold (Ni/Pd/Au).

* * * * *